United States Patent
Delfino et al.

(10) Patent No.: US 10,713,826 B2
(45) Date of Patent: Jul. 14, 2020

(54) COMPUTER-IMPLEMENTED METHOD FOR DRAWING A POLYLINE IN A THREE-DIMENSIONAL SCENE

(71) Applicant: Dassault Systemes, Velizy Villacoublay (FR)

(72) Inventors: Christophe Rene Francis Delfino, Saint Laurent du Var (FR); Nicolas Arques, Nice (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 0 days.

(21) Appl. No.: 15/371,642

(22) Filed: Dec. 7, 2016

(65) Prior Publication Data

US 2017/0161924 A1    Jun. 8, 2017

(30) Foreign Application Priority Data

Dec. 8, 2015 (EP) ................................... 15306956

(51) Int. Cl.
| | |
|---|---|
| *G06T 11/20* | (2006.01) |
| *G06F 30/00* | (2020.01) |
| *G06T 3/00* | (2006.01) |
| *G06T 3/40* | (2006.01) |
| *G06T 19/20* | (2011.01) |

(52) U.S. Cl.
CPC ............ *G06T 11/203* (2013.01); *G06F 30/00* (2020.01); *G06T 3/0081* (2013.01); *G06T 3/40* (2013.01);
(Continued)

(58) Field of Classification Search
CPC .................................................. G06T 11/203
(Continued)

(56) References Cited

U.S. PATENT DOCUMENTS

| | | | |
|---|---|---|---|
| 5,771,043 A | 6/1998 | Nigawara et al. | |
| 6,157,383 A * | 12/2000 | Loop ................... | G06F 3/04812 345/419 |
| 6,426,745 B1 | 7/2002 | Isaacs et al. | |
| 2007/0168392 A1* | 7/2007 | Delarue ................ | G06F 17/50 |

FOREIGN PATENT DOCUMENTS

| | | |
|---|---|---|
| EP | 0421818 A2 | 4/1991 |
| EP | 1059581 A2 | 12/2000 |
| EP | 2827303 A1 | 7/2013 |

OTHER PUBLICATIONS

Terii Stein and Sabine Coquillart, The Metric Cursor, 2000, IEEE Computer Graphics and Applications, Proceedings of The Eighth Pacific Conference on, pp. 381-386, and 458.*

(Continued)

*Primary Examiner* — Hai Tao Sun
(74) *Attorney, Agent, or Firm* — Hamilton, Brook, Smith & Reynolds, P.C.

(57) ABSTRACT

A computer-implemented method of drawing a polyline in a three-dimensional scene: a) draws a segment (S1) of said polyline in said three-dimensional scene, said segment having a starting point (P1) and an endpoint (P2); b) displays, in the three-dimensional scene, a graphical tool (PST) representing a set of three orthogonal planes (PLA, PLB, PLC), one of said planes being orthogonal to the segment; c) selects one of said planes; and d) draws another segment of the polyline (S2), having a starting point coinciding with the endpoint of the segment drawn in step a) and lying in the plane (PLA) selected in step c). Steps a), c) and d) are carried out based on input commands provided by a user. A computer program product, non-volatile computer-readable data-storage medium and Computer Aided Design or three-dimensional illustration authoring system carries out such a method.

17 Claims, 6 Drawing Sheets

(52) U.S. Cl.
CPC .......... *G06T 19/20* (2013.01); *G06T 2200/24* (2013.01); *G06T 2207/20092* (2013.01); *G06T 2219/016* (2013.01); *G06T 2219/2004* (2013.01)

(58) Field of Classification Search
USPC ........................................................ 345/419
See application file for complete search history.

(56) References Cited

OTHER PUBLICATIONS

Eric A . Bier, Snap-Dragging in Three Dimensions, 1990 ACM 089791-351-5/90/0003/0193, pp. 193-204.*
Extended European Search Report, European Counterpart Application No. EP 15 30 6956, Date of Completion of Search: Apr. 4, 2016, 13 pages.
Bier, E. A: "Snap-dragging in three dimensions," *Proceedings Symposium on Interactive 3d Graphics*, New York, NY, US, vol. 24, No. 2, Mar. 25, 1990, pp. 193-204, XP002292097.
Conner, D. B., et al., ED—Association for Computing 1, 6-13 Machinery: "Three-Dimensional Widgets", *Proceedings of the Symposium on a Interactive 3d Graphics*, Cambridge, MA, Mar. 29-Apr. 1, 1992; [Proceedings of the Symposium on Interactive 3D Graphics], New York, ACM, US, vol. Mar. 29, 1992 (Mar. 29, 1992), pp. 183-188, XP000308193.
Stein, T., et al. "The metric cursor", *Computer Graphics and Applications*, 2000, Proceedings. The Eighth Pacific Conference on Hong Kong, China Oct. 3-5, 2000, Los Alamitos, CA, USA, IEEE Comput. Soc, US, Oct. 3, 2000, pp. 381-386 XP010523031.

* cited by examiner

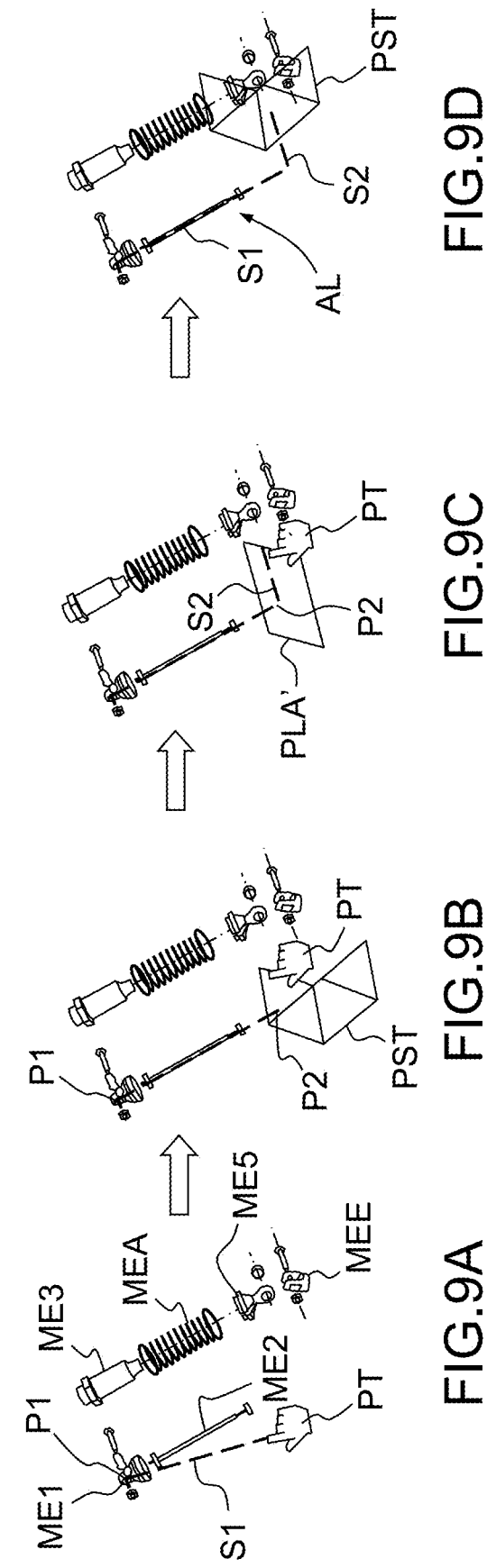

COMPUTER-IMPLEMENTED METHOD FOR DRAWING A POLYLINE IN A THREE-DIMENSIONAL SCENE

RELATED APPLICATION(S)

This application claims priority under 35 U.S.C. § 119 or 365 to Europe, Application No. 15306956.2, filed Dec. 8, 2015. The entire teachings of the above application(s) are incorporated herein by reference.

FIELD OF THE INVENTION

The invention relates to a computer-implemented method for drawing a polyline, i.e. a broken line, in a three-dimensional (3D) scene. The polyline may, in particular, be an assembly path, i.e. a polyline used to illustrate how the elements of a system, shown in an exploded view, are assembled.

The invention applies to the field of computer graphics, and more particularly to the field of Computer Aided Design (CAD) and illustration authoring. The invention is particularly suitable for producing technical illustrations, marketing presentations, assembly illustrations, training materials etc.

BACKGROUND

In all the applications above, there is a need of creating exploded views of assemblies or sub-assemblies, to illustrate a nomenclature for instance. An example of such an exploded view is provided in FIG. 1. As it can be seen on the figure, dashed polylines AL, called "assembly lines", are used to indicate the original location of the parts and the way they have been removed from there (assembly paths). In order to allow a good understanding of the exploded view, in most cases (but not always) the segments of the polyline are mutually perpendicular and usually oriented parallel or perpendicular to a "world axis" of the view.

A first possibility for designing assembly lines consists in drawing the polylines freely in the plane defined by the current point of view. Otherwise stated, the polyline is drawn in two dimensions (2D), and automatically integrated into the three-dimensional representation of the scene. The angle between consecutive segments of the polyline may not take accurate values (e.g. 45° or 90°); most importantly, as the polyline is not properly situated in three-dimensions, they are lost if the user changes the point of view. This is illustrated on FIG. 2: the left part of the figure shows a polyline drawn in two-dimensions, which gives the illusion of being constituted of mutually perpendicular segments in 2D space; the illusion is completely lost if the scene is rotated in three dimensions.

Another approach, illustrated on FIG. 3, uses planar grids to properly draw the segments of the polyline. A drawback of this technique is that it is quite cumbersome to create and position a grid before drawing each segment. Also, drawing a complex three-dimensional polyline requires the simultaneous display of several grids, which may be confusing for the user and demanding (essentially in terms of memory space) for the Computer Aided Design/illustration authoring system.

Yet another approach is to use software for automatically creating a path (i.e. a polyline) between the original position of a part to a new one. This approach is not flexible enough, as the user has no control on the position of the "breakings" of the line. The result is often unsatisfactory for a human end user, as depicted on FIG. 4.

SUMMARY OF THE INVENTION

The invention aims at overcoming these drawbacks of the prior art. More specifically the invention aims at providing a simple and effective method for drawing polylines in a three-dimensional scene, with a sufficient degree of flexibility and yet allowing an accurate determination of the angles between segments of the polyline.

According to the invention, this aim is achieved by the use of a particular graphical tool, which may be called a "plane selector". This tool is displayed for the first time after the drawing of a first segment; it allows the user to select a plane parallel or perpendicular to this segment, then creates a grid "on the fly" on the selected plane to ease the drawing of the successive segment, and so on. This way the user can draw the polyline step by step, choosing the positioning on the breakings and (with some constraints) the angles formed by the different segments, while being relieved from the burden of manually positioning the drawing grids.

An object of the present invention is then a computer-implemented method for drawing a polyline (AL) in a three-dimensional scene comprising the steps of:

a) drawing a segment of said polyline in said three-dimensional scene, said segment having a starting point and an endpoint;

b) displaying, in the three-dimensional scene, a graphical tool representing a set of three orthogonal planes, one of said planes being orthogonal to the segment;

c) selecting one of said planes; and d) drawing another segment of the polyline, having a starting point coinciding with the endpoint of the segment drawn in step a) and lying in the plane selected in step c);

said steps a), c) and d) being carried out according to input commands provided by a user.

According to particular embodiments of the inventive method:

Said step d) may further comprise displaying an enlarged representation of the selected plane, provided with a grid, on which said segment of the polyline is drawn.

Said grid may comprise snap points to assist the user in the drawing of the segment. More particularly, said grid may comprise a circular pattern of snap points disposed around the starting point of the segment to be drawn.

Said step d) may comprise selecting an endpoint of said segment by the user using a pointer tool, and automatically adapting the displayed enlarged representation the selected plane in such a way that the pointer tool constantly remains within it.

The enlarged representation the selected plane may be deleted during or after the completion of step d).

The graphical tool may be deleted during after the completion of one of steps c) and d).

Said steps b) to d) may be iterated a plurality of times.

Said step b) may comprise displaying said graphical tool proximate to the endpoint of the segment.

Another object of the invention is a computer program product, stored on a non-volatile computer-readable data-storage medium, comprising computer-executable instructions to cause a computer system to carry out such a method.

Another object of the invention is a non-volatile computer-readable data-storage medium containing computer-executable instructions to cause a computer system to carry out such a method.

Another object of the invention is a Computer Aided Design system comprising a processor coupled to a memory and a graphical user interface, the memory storing computer-executable instructions to cause the Computer Aided Design system to carry out such a method.

Yet another object of the invention is a three-dimensional illustration authoring system comprising a processor coupled to a memory and a graphical user interface, the memory storing computer-executable instructions to cause the three-dimensional illustration authoring system to carry out such a method.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

Additional features and advantages of the present invention will become apparent from the subsequent description, taken in conjunction with the accompanying drawings, which show:

FIGS. 9A-9D the application of the invention to the drawing of an assembly line in the exploded view of a mechanical assembly.

DETAILED DESCRIPTION OF THE INVENTION

A description of example embodiments of the invention follows.

Hereafter, a "three-dimensional" (or "3D") object will be an object, or rather its digital representation in a computer system, allowing a three-dimensional (3D) graphical representation. A 3D representation allows the viewing of the part from all angles. For example, a 3D object, when 3D represented, may be handled and turned around any of its axes, or around any axis in the screen on which the representation is displayed. A three-dimensional scene is constituted by a plurality of 3D objects disposed in a three-dimensional space.

Conversely, a "two-dimensional" (or "2D") object will be an object only allowing a two-dimensional (2D) representation e.g. on a plane. For example, a 2D object may only be translated in the plane of the screen on which the representation is displayed, or rotated around an axis perpendicular to said screen.

Figure 1:
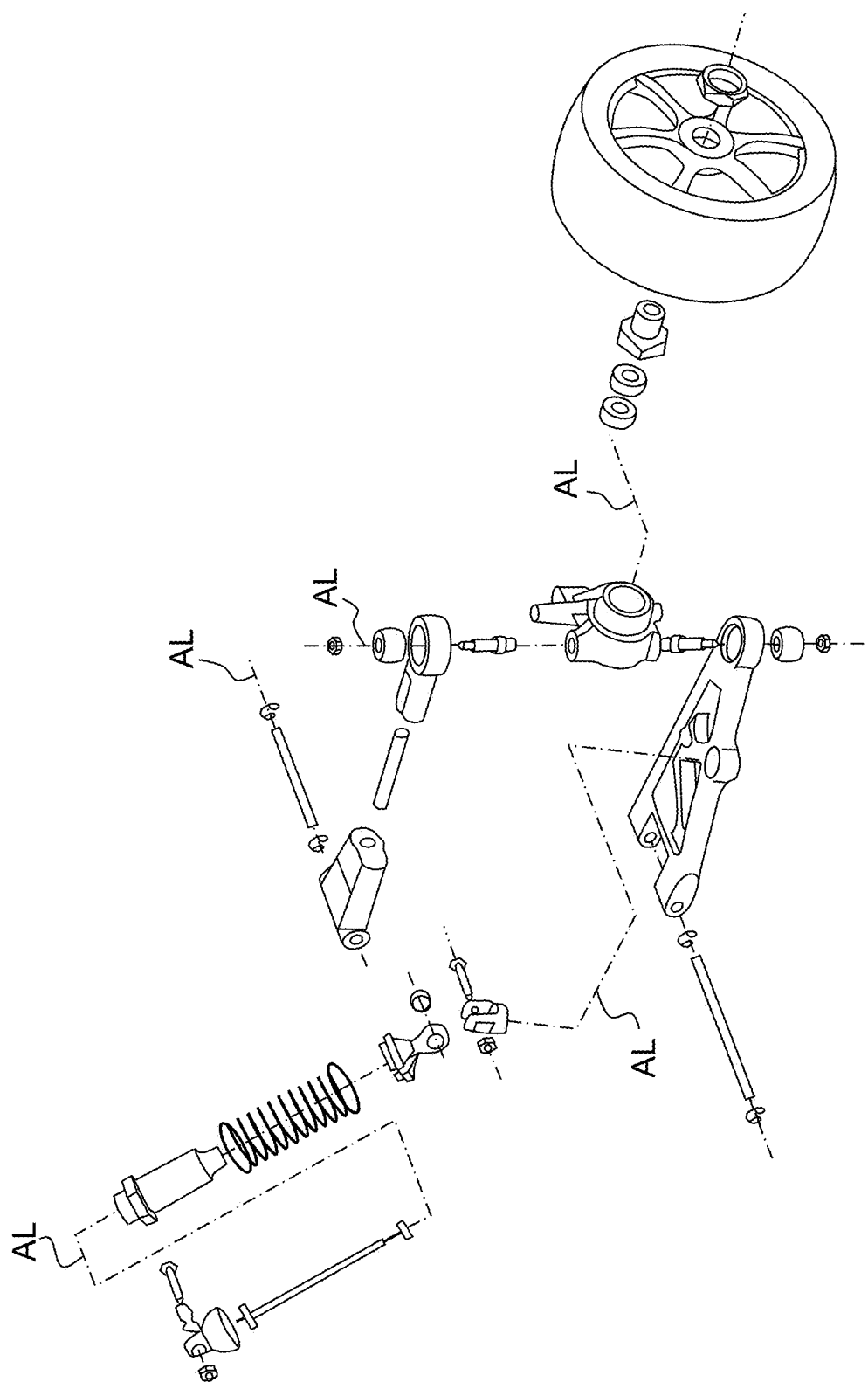
FIG. 1, described above, the exploded view of a mechanical assembly, showing a plurality of assembly lines.
Figure 2:
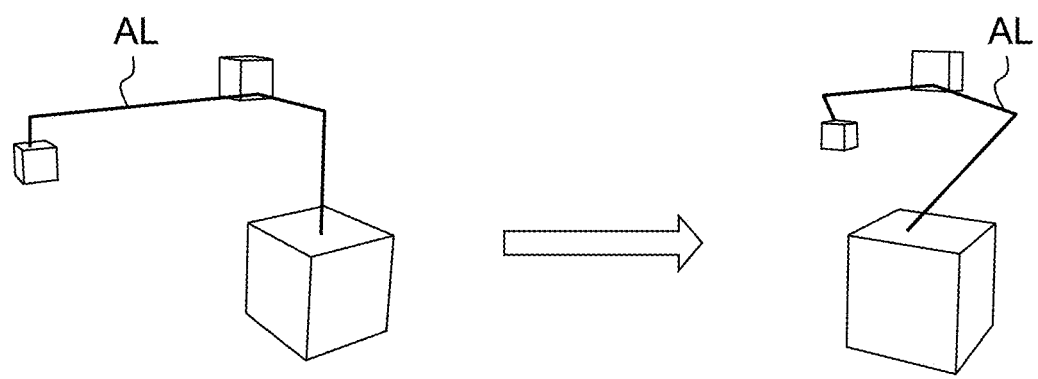
FIGS. 2 to 4, also described above, assembly lines drawn using methods known from the prior art.
Figure 3:
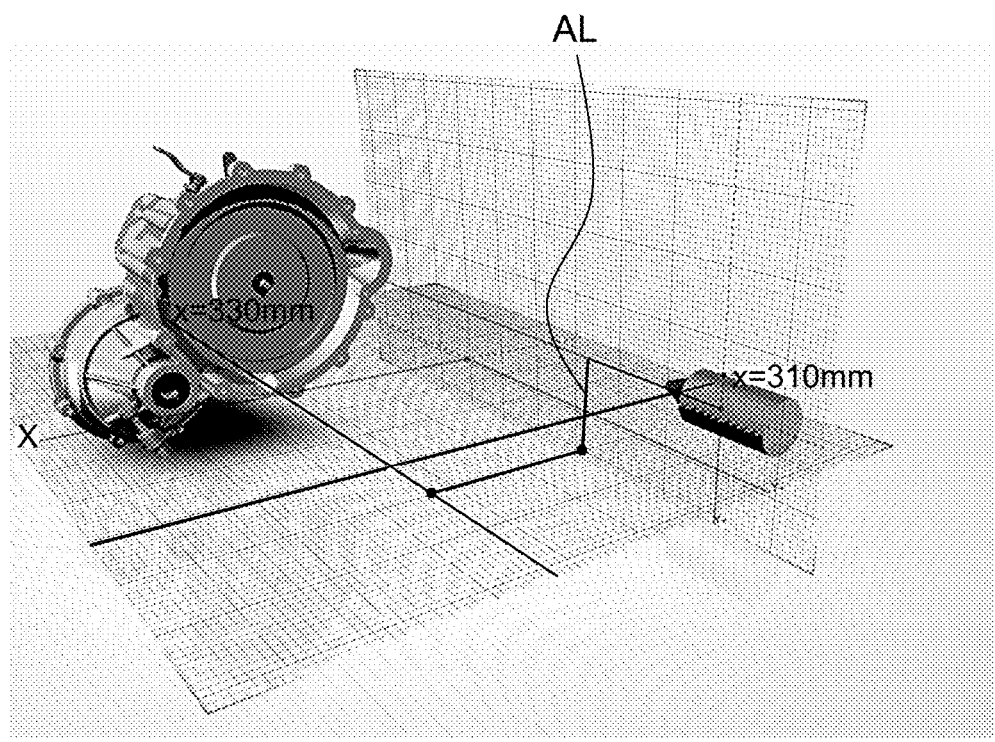
Figure 4:
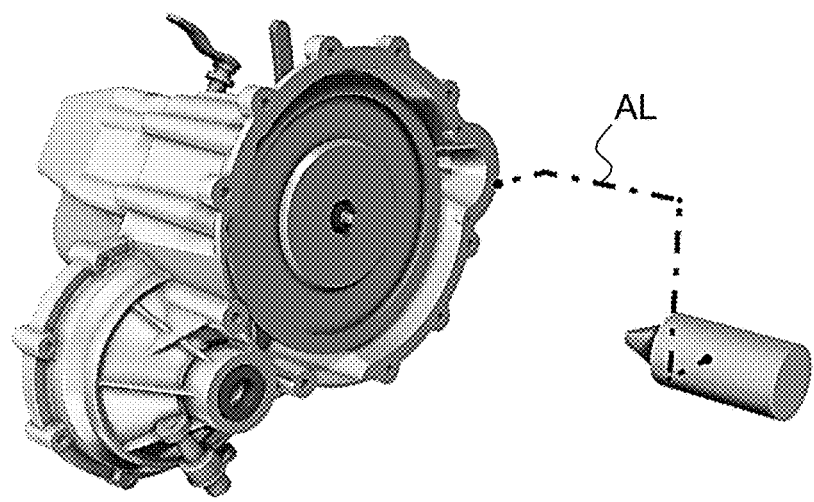
Figure 5A:
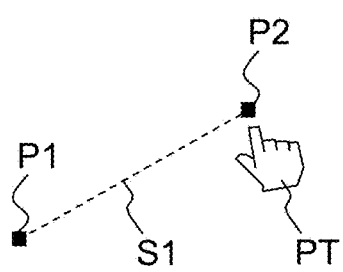
FIGS. 5A to 5D, the step of a method according to an embodiment of the invention.

The first step of the inventive method, illustrated on FIG. 5A, consists in drawing a first segment S1 of the polyline. The direction of the first segment is freely chosen by the user; it may, for instance correspond to that of an axis of a piece of the assembly. Typically, in order to draw the first segment S1, the user selects a first anchor point P1 (starting point) and a second anchor point P2 (endpoint) of the three-dimensional scene using a pointer tool PT moved e.g. using a pointing device such as a mouse, a roller ball or a track pad, or a touch screen. There are different ways for selecting a point in 3D using a pointing device. For example:
  if the user clicks on an object of the 3D scene, the point is situated on the surface of the object (more precisely, on the grid representing the surface of the object);
  otherwise, the point is situated by projecting the pointer tool onto a plane parallel to the screen and positioned at mid-depth within a "box" containing the scene.

Then the Computer Aided Design or illustration authoring system traces the segment S1 by linking the starting point P1 to the endpoint P2. In a manner known in the art, the Computer Aided Design or illustration authoring system may continuously trace a segment linking the starting point P1 to the pointer tool PT, until the endpoint P2 is selected thus "fixing" the direction of the segment.

Figure 5B:
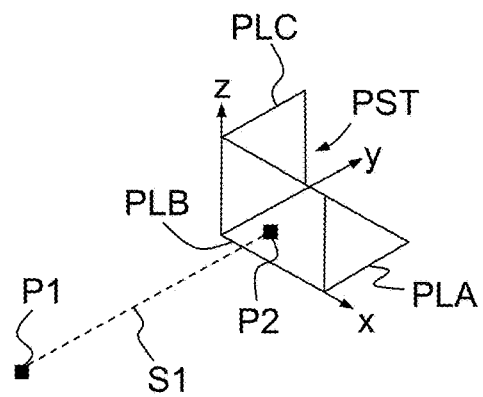

Then, as illustrated on FIG. 5B, the Computer Aided Design or illustration authoring system displays a graphical tool PST—called a "plane selector"—near to or overlapping the endpoint P2 of the first segment. The plane selector PST comprises a symbolic representation of three mutually orthogonal planes, one of which (reference PLA) is perpendicular to the segment S1 while the two others (PLB, PLC) are parallel to it. Otherwise stated, the planes PLA, PLB, PLC correspond to the "xy", "xz" and "yz" planes of an orthonormal coordinate system xyz, wherein the "y" axis has the direction of the segment S1. The endpoint P2 of the first segment belongs to all of the three planes, and therefore it constitutes the origin of the orthonormal coordinate system xyz. This is not apparent on FIG. 5B, because the plane selector PST only provides a symbolic representation of the planes.

In the example of FIG. 5B the plane selector has the appearance of a "half cube", but this is not essential.

Figure 5C:
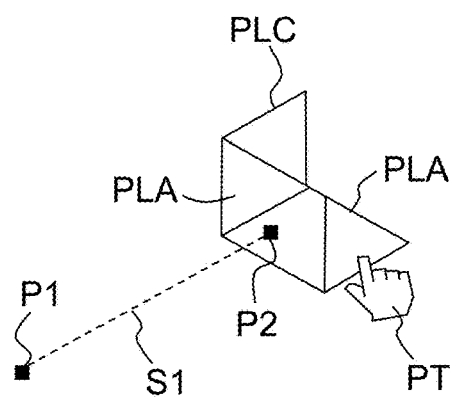

The user selects one of the planes (e.g. PLA) of the plane selector, for instance by placing the pointer tool PT on it and by "clicking" on a button of the pointing device; see FIG. 5C. The plane selector PLC is no more required and may disappear or fade away; instead, an enlarged representation PLA' of the selected plane is displayed; this representation may consists in a rectangle lying in the plane, which is conceptually infinite. Both the anchor point P2—which will serve as the starting point of the next segment of the polyline—and the pointer tool PT are included in the enlarged representation PLA'; advantageously, the size of the latter is dynamically adapted to follow the movements of the pointer tool.

Figure 5D:
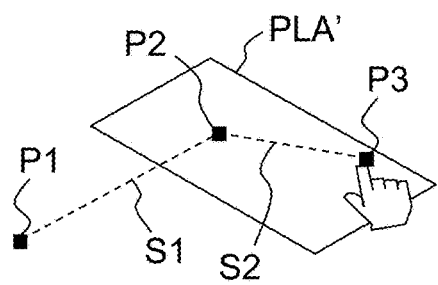

Then, the user selects—e.g. by moving the pointer tool PT to a desired location and then "clicking"—a new anchor point P3 on the enlarged representation PLA' of the selected plane, and the Computer Aided Design or illustration authoring system traces a new segment S2 having P3 as its endpoint and P2 as its starting point. This step, illustrated on FIG. 5D, is similar to the one discussed above in reference to FIG. 5A, except that this time the anchor point P3 is constrained to lie on the selected plane.

When the endpoint P3 of the second segment S2 has been selected, the Computer Aided Design or illustration authoring system displays the plane selector again, and the previously-described steps are iterated until the user inputs a command which stops the drawing process—e.g. by pressing the "esc" key of a keyboard.

Figure 6:
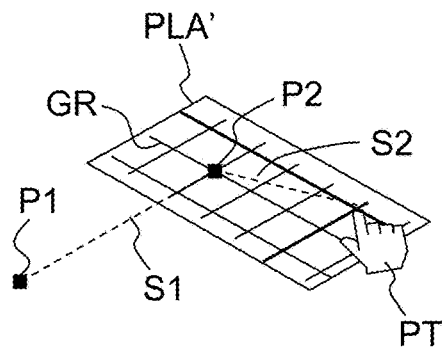
FIGS. 6 and 7A-7C, alternative embodiments of the step illustrated by FIG. 5D.

Advantageously the enlarged representation PLA' of the selected plane carries a grid, e.g. a squared-patterned grid GR, in order to assist the user in selecting a suitable endpoint P3; this is represented on FIG. 6. Without such a grid, it would be difficult to obtain a precise angular relationship between segments of the polyline, e.g. to draw mutually perpendicular segments.

Figure 7A:
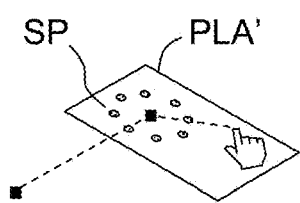
Figure 7B:
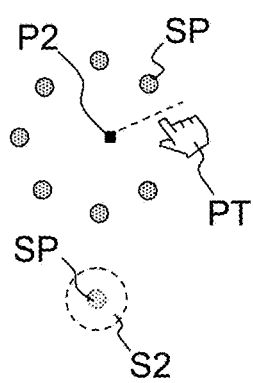
Figure 7C:
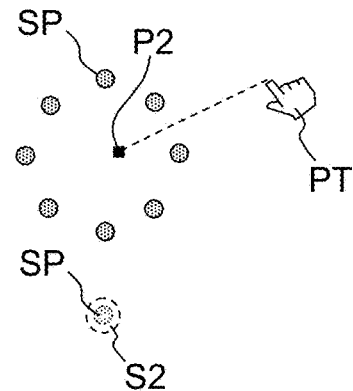

Advantageously, the grid may comprise a plurality of snap points SP. A snap point is a point which "attracts" the segment: when the segment crosses a snap zone SZ centered on the snap point, its orientation is suddenly changed (it "jumps") in such a way that it passes through the snap point. The snap points may be placed at the vertices of a squared-patterned grid or, as shown on FIGS. 7A-7C, they may form a circular pattern disposed around the starting point P2 of the segment to be drawn. In a particular embodiment, the width of the snapping zones depends on the position of the pointer tool: the farther the pointer tool is from the starting point P2, the smaller are the snapping zones (see FIGS. 7B and 7C). This allows the user to choose between a precise, but rather inflexible, orientation of the segment determined by snap points and a free—but possibly inaccurate orientation obtained without resorting to snapping.

Figure 8A:
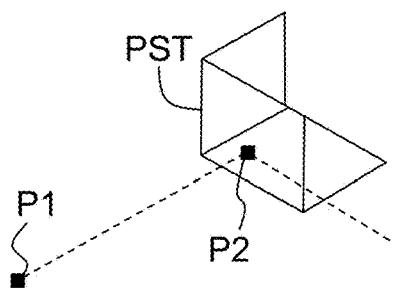
FIGS. 8A and 8B, the drawing of a freely-oriented segment.
Figure 8B:
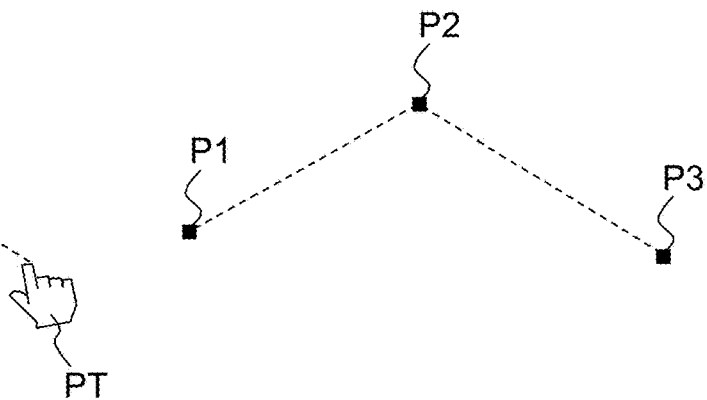

The plane selector tool helps the user to accurately draw the segments of the polyline, but it imposes a constraint: each segment other than the first one must lie in a plane which is either parallel or perpendicular to the previously drawn segment. The user may then, in some cases, prefer to draw the segments freely, without the help of the plane selector. According to a particular embodiment of the invention, the plane selector tool PST may fade away and eventually disappear if the pointing device moves off from it without having selected one of its planes; this is illustrated on FIGS. 8A, 8B.

FIGS. 9A-9D illustrate the process of drawing an assembly line for an exploded view comprising a plurality of mechanical elements ME1, ME2, ME3, ME4, ME5, ME6 using a method according to the invention. The first anchor point P1 is positioned on a first mechanical element ME1 and the second anchor point P2 is chosen such that the first segment S1 of the assembly line AL is aligned with element ME2. A plane selecting tool PST is then displayed in order to assist in the drawing of a second segment S2, and then of a third one (not represented).

The inventive method can be performed by a suitably-programmed general-purpose computer or computer system, possibly including a computer network, storing a suitable program in non-volatile form on a computer-readable medium such as a hard disk, a solid state disk or a CD-ROM and executing said program using its microprocessor(s) and memory.

Figure 10:
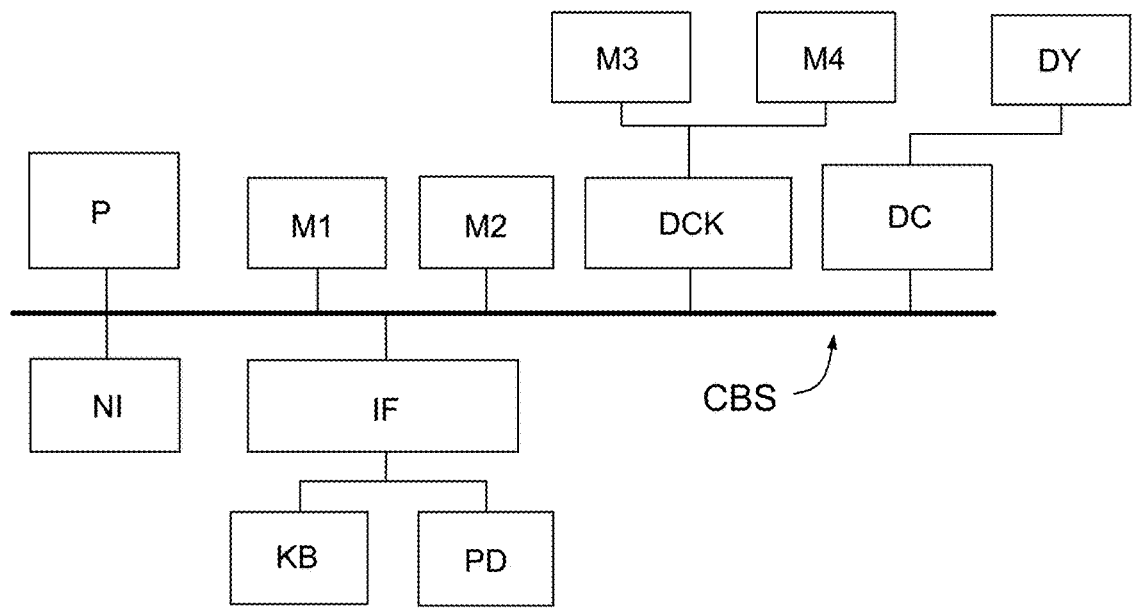
FIGS. 10 and 11, block diagrams of respective computer systems suitable for carrying out a method according to different embodiments of the invention.

A computer—more precisely a Computer Aided Design or illustration authoring system, or station—suitable for carrying out a method according to an exemplary embodiment of the present invention is described with reference to FIG. 10. In FIG. 10, the computer includes a Central Processing Unit (CPU) P which performs the processes described above. The process can be stored as an executable program, i.e. a set of computer-readable instructions in memory, such as RAM M1 or ROM M2, or on hard disk drive (HDD) M3, DVD/CD drive M4, or can be stored remotely. Moreover, one or more computer files defining the three-dimensional scene (e.g. an exploded view of an assembly of objects) in which a polyline has to be drawn may also be stored on one or more of memory devices M1 to M4, or remotely.

The claimed invention is not limited by the form of the computer-readable media on which the computer-readable instructions and/or the digital files of the inventive process are stored. For example, the instructions and files can be stored on CDs, DVDs, in FLASH memory, RAM, ROM, PROM, EPROM, EEPROM, hard disk or any other information processing device with which the Computer Aided Design or illustration authoring station communicates, such as a server or computer. The program and the files can be stored on a same memory device or on different memory devices.

Further, a computer program suitable for carrying out the inventive method can be provided as a utility application, background daemon, or component of an operating system, or combination thereof, executing in conjunction with CPU 800 and an operating system such as Microsoft VISTA, Microsoft Windows 8, UNIX, Solaris, LINUX, Apple MAC-OS and other systems known to those skilled in the art.

CPU P can be a Xenon processor from Intel of America or an Opteron processor from AMD of America, or can be other processor types, such as a Freescale ColdFire, IMX, or ARM processor from Freescale Corporation of America. Alternatively, the CPU can be a processor such as a Core2 Duo from Intel Corporation of America, or can be implemented on an FPGA, ASIC, PLD or using discrete logic circuits, as one of ordinary skill in the art would recognize. Further, the CPU can be implemented as multiple processors cooperatively working to perform the computer-readable instructions of the inventive processes described above.

The Computer Aided Design or illustration authoring station in FIG. 10 also includes a network interface NI, such as an Intel Ethernet PRO network interface card from Intel Corporation of America, for interfacing with a network, such as a local area network (LAN), wide area network (WAN), the Internet and the like. The Computer Aided Design or illustration authoring station further includes a display controller DC, such as a NVIDIA GeForce GTX graphics adaptor from NVIDIA Corporation of America for interfacing with display DY, such as a Hewlett Packard HPL2445w LCD monitor. A general purpose I/O interface IF interfaces with a keyboard KB and pointing device PD, such as a roller ball, mouse, touchpad and the like. The display, the keyboard and the pointing device, together with the display controller and the I/O interfaces, form a graphical user interface, used by the user to provide input commands—e.g. to move the pointer tool, select a point or a plane . . . —and by the Computer Aided Design or illustration authoring station for displaying the three-dimensional scene, the graphical tools (plane selector, pointer tool) and the polyline.

Disk controller DKC connects HDD M3 and DVD/CD M4 with communication bus CBS, which can be an ISA, EISA, VESA, PCI, or similar, for interconnecting all of the components of the Computer Aided Design or illustration authoring station.

A description of the general features and functionality of the display, keyboard, pointing device, as well as the display controller, disk controller, network interface and I/O interface is omitted herein for brevity as these features are known.

Figure 11:
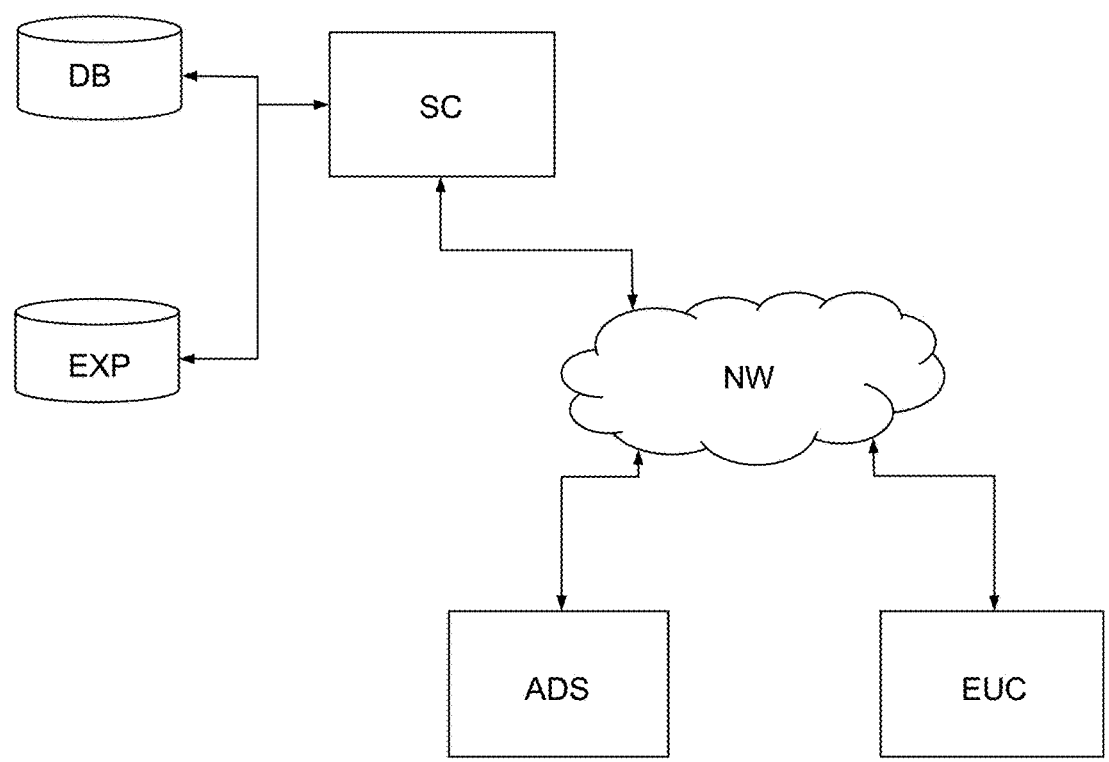

FIG. 11 is a block diagram of a computer system suitable for carrying out a method according to a different exemplary embodiment of the present invention.

In FIG. 11, the executable program EXP and the computer files defining the three-dimensional scene are stored on memory devices connected to a server SC. The memory devices and the overall architecture of the server may be the same as discussed above with reference to FIG. 10, except that display controller, display, keyboard and/or pointing device may be missing in the server.

The server SC is then connected to an administrator system ADS and end user computer EUC via a network NW.

The overall architectures of the administrator system and of the end user computer may be the same as discussed above with reference to FIG. 10, except that the memory devices of the administrator system and the end user computer do not store the executable program EXP and/or the computer files defining the three-dimensional scene. However, the end user computer does store a client program designed for cooperating with the executable program of the server, as it will be discussed below.

As can be appreciated, the network NW can be a public network, such as the Internet, or a private network such as an LAN or WAN network, or any combination thereof and can also include PSTN or ISDN sub-networks. The network NW can also be wired, such as an Ethernet network, or can be wireless such as a cellular network including EDGE, 3G and 4G wireless cellular systems. The wireless network can also be Wi-Fi, Bluetooth, or any other wireless form of communication that is known. Thus, the network NW is merely exemplary and in no way limits the scope of the present advancements.

The client program stored in a memory device of the end user computer and executed by a CPU of the latter accesses, via the network NW, a database DB stored by the server SC and containing files defining three-dimensional scenes in which a polyline may be drawn. This allows an end user to open and possibly modify such a file, to parameterize a graphical representation of the scene and to create one or more polylines as described above. The server performs the processing as described above, and transmits to the end user computer an image file corresponding to the desired representation of the scene including the polyline, again using the network NW.

Although only one administrator system ADS and one end user system EUX are shown, the system can support any number of administrator systems and/or end user systems without limitation. Similarly, multiple servers can also be implemented in the system without departing from the scope of the present invention.

Any processes described herein should be understood as representing modules, segments, or portions of code which include one or more executable instructions for implementing specific logical functions or steps in the process, and alternate implementations are included within the scope of the exemplary embodiment of the present invention.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method for drawing a polyline in a three-dimensional scene displayed on a computer screen, the method comprising the steps of:
    a) drawing, using a first graphical tool, a segment of said polyline in said three-dimensional scene and displaying the segment on the computer screen, said segment having a starting point and an endpoint;
    b) displaying on the computer screen, in the three-dimensional scene, a second graphical tool, the second graphical tool distinct from the first graphical tool and representing a set of three orthogonal planes, the endpoint of the segment belonging to all of said planes and one of said planes being orthogonal to the segment;
    c) selecting one of said planes; and
    d) enlarging the selected plane of the second graphical tool and providing the enlarged selected plane with a grid, and drawing on said enlarged selected plane, using the first graphical tool, another segment of the polyline having a starting point coinciding with the endpoint of the segment drawn in step a);
    said steps a), c) and d) being carried out according to input commands provided by a user through an input device;
    wherein steps b), c), and d) are carried out iteratively until completion of the polyline, the method further comprising a step of displaying on the computer screen the three-dimensional scene including the completed polyline.

2. A computer-implemented method according to claim 1, wherein said grid comprises snap points.

3. A computer-implemented method according to claim 2, wherein said grid comprises a circular pattern of snap points disposed around the starting point of each segment to be drawn.

4. A computer-implemented method according to claim 1 wherein step d) comprises selecting an endpoint of said another segment by the user using a pointer tool, and automatically adapting the enlarged selected plane in such a way that the pointer tool constantly remains within the enlarged selected plane.

5. A computer-implemented method according to claim 1, wherein the enlarged selected plane is deleted during or after the completion of step d).

6. A computer-implemented method according to claim 1, wherein the second graphical tool is deleted during or after the completion of one of steps c) and d).

7. A computer-implemented method according to claim 1, wherein said step b) comprises displaying said second graphical tool proximate to the endpoint of the segment.

8. A computer program product comprising:
    a non-volatile computer-readable data-storage medium, storing computer-executable instructions;
    the stored instructions embodying a program drawing a polyline in a three-dimensional scene displayed on a computer screen, the stored instructions when executed cause a computer system to:
    a) draw, using a first graphical tool, a segment of said polyline in said three-dimensional scene and display the segment on the computer screen, said segment having a starting point and an endpoint;
    b) display on the computer screen, in the three-dimensional scene, a second graphical tool, the second graphical tool distinct from the first graphical tool and representing a set of three orthogonal planes, the endpoint of the segment belonging to all of said planes and one of said planes being orthogonal to the segment;
    c) select one of said planes; and
    d) enlarge the selected plane of the second graphical tool and provide the enlarged selected plane with a grid, and draw on said enlarged selected plane, using the first graphical tool, another segment of the polyline having a starting point coinciding with the endpoint of the segment drawn in a);
    said drawing of a), selecting of c) and drawing of d) being carried out according to input commands provided by a user through an input device;
    wherein b), c), and d) are carried out iteratively until completion of the polyline, and where the stored instructions, when executed, further cause the computer system to display on the computer screen the three-dimensional scene including the completed polyline.

9. A non-volatile computer-readable data-storage medium comprising:
a memory portion containing computer-executable instructions to cause a computer system to draw a polyline in a three-dimensional scene displayed on a computer screen by:
a) drawing, using a first graphical tool, a segment of said polyline in said three-dimensional scene and displaying the segment on the computer screen, said segment having a starting point and an endpoint;
b) displaying on the computer screen, in the three-dimensional scene, a second graphical tool, the second graphical tool distinct from the first graphical tool and representing a set of three orthogonal planes, the endpoint of the segment belonging to all of said planes and one of said planes being orthogonal to the segment;
c) selecting one of said planes; and
d) enlarging the selected plane of the second graphical tool and providing the enlarged selected plane with a grid, and drawing on said enlarged selected plane, using the first graphical tool, another segment of the polyline having a starting point coinciding with the endpoint of the segment drawn in step a);
said steps a), c) and d) being carried out according to input commands provided by a user through an input device;
wherein steps b), c), and d) are carried out iteratively until completion of the polyline, and where the computer-executable instructions further cause the computer system to display on the computer screen the three-dimensional scene including the completed polyline.

10. A Computer Aided Design system comprising:
a processor coupled to a memory and a graphical user interface, the memory storing computer-executable instructions to cause the Computer Aided Design system to draw a polyline in a three-dimensional scene displayed on a computer screen by:
a) drawing, using a first graphical tool, a segment of said polyline in said three-dimensional scene and displaying the segment on the computer screen, said segment having a starting point and an endpoint;
b) displaying on the computer screen, in the three-dimensional scene, a second graphical tool, the second graphical tool distinct from the first graphical tool and representing a set of three orthogonal planes, the endpoint of the segment belonging to all of said planes and one of said planes being orthogonal to the segment;
c) selecting one of said planes; and
d) enlarging the selected plane of the second graphical tool and providing the enlarged selected plane with a grid, and drawing on said enlarged selected plane, using the first graphical tool, another segment of the polyline, having a starting point coinciding with the endpoint of the segment drawn in step a);
said steps a), c) and d) being carried out according to input commands provided by a user through an input device;
wherein steps b), c), and d) are carried out iteratively until completion of the polyline, and where the computer-executable instructions further cause the Computer Aided Design system to display on the computer screen the three-dimensional scene including the completed polyline.

11. A three-dimensional illustration authoring system comprising:
a processor coupled to a memory and a graphical user interface, the memory storing computer-executable instructions to cause the three-dimensional illustration authoring system to carry out drawing a polyline in a three-dimensional scene displayed on a computer screen, the computer executable instructions include instructions to:
a) draw, using a first graphical tool, a segment of said polyline in said three-dimensional scene and display the segment on the computer screen, said segment having a starting point and an endpoint;
b) display on the computer screen, in the three-dimensional scene, a second graphical tool, the second graphical tool distinct from the first graphical tool and representing a set of three orthogonal planes, the endpoint of the segment belonging to all of said planes and one of said planes being orthogonal to the segment;
c) select one of said planes; and
d) enlarge the selected plane of the second graphical tool and provide the enlarged selected plane with a grid, and draw on said enlarged selected plane, using the first graphical tool, another segment of the polyline having a starting point coinciding with the endpoint of the segment drawn in a);
said instructions of a), c) and d) being carried out according to input commands provided by a user through an input device;
wherein said instructions of b), c), and d) are carried out iteratively until completion of the polyline and the computer executable instructions further include instructions to display on the computer screen the three-dimensional scene including the completed polyline.

12. A system as claimed in claim 11, wherein said grid comprises snap points.

13. A system as claimed in claim 12, wherein said grid comprises a circular pattern of snap points disposed around the starting point of each segment to be drawn.

14. A system as claimed in claim 11 wherein the instructions of d) comprises selecting an endpoint of said another segment by the user using a pointer tool, and automatically adapting the enlarged selected plane in such a way that the pointer tool constantly remains within the enlarged selected plane.

15. A system as claimed in claim 11, wherein the enlarged selected plane is deleted during or after the completion of the instructions of d).

16. A system as claimed in claim 11, wherein the second graphical tool is deleted during or after the completion of the instructions of one of c) and d).

17. A system as claimed in claim 11, wherein said instructions of b) comprises displaying said second graphical tool proximate to the endpoint of the segment.

* * * * *